United States Patent
Green et al.

(10) Patent No.: US 7,043,495 B1
(45) Date of Patent: May 9, 2006

(54) TECHNIQUES FOR JEDEC FILE INFORMATION INTEGRITY AND PRESERVATION OF DEVICE PROGRAMMING SPECIFICATIONS

(75) Inventors: David J. Green, Snohomish, WA (US); Sungyong Pak, Seattle, WA (US); Fangyuan Nan, Kenmore, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 358 days.

(21) Appl. No.: 09/916,453

(22) Filed: Jul. 27, 2001

(51) Int. Cl.
*G06F 17/30* (2006.01)

(52) U.S. Cl. .............. 707/102; 707/1; 707/9; 707/100; 707/200; 714/52; 714/53; 714/54

(58) Field of Classification Search .......... 714/1, 714/17, 704, 748, 758, 767, 811, 815, 3, 5, 714/10, 49–54; 326/138, 40–41; 707/11, 707/10, 100, 102, 157, 103 R, 200, 1–6, 707/104.1; 709/204, 217, 220, 236, 245, 709/218; 370/465, 493, 528, 535; 703/15; 716/1, 16; 345/73, 771
See application file for complete search history.

(56) References Cited

U.S. PATENT DOCUMENTS

| | | | |
|---|---|---|---|
| 4,730,348 A | 3/1988 | MacCrisken | 375/122 |
| 5,090,015 A | 2/1992 | Dabbish et al. | 371/22.5 |
| 5,128,871 A * | 7/1992 | Schmitz | 716/17 |
| 5,396,505 A * | 3/1995 | Freeman et al. | 714/811 |
| 5,396,595 A | 3/1995 | Standley | 710/68 |
| 5,635,855 A | 6/1997 | Tang | 326/38 |
| 5,805,862 A * | 9/1998 | Winter et al. | 703/15 |
| 6,121,903 A | 9/2000 | Kalkstein | 341/63 |
| 6,138,229 A | 10/2000 | Kucukcakar et al. | 712/37 |
| 6,177,892 B1 | 1/2001 | Ko | 341/106 |
| 6,255,848 B1 * | 7/2001 | Schultz et al. | 326/41 |
| 6,401,230 B1 * | 6/2002 | Ahanessians et al. | 716/1 |
| 6,446,145 B1 | 9/2002 | Har et al. | 710/68 |
| 6,487,709 B1 | 11/2002 | Keller et al. | 716/14 |
| 6,873,630 B1 * | 3/2005 | Muller et al. | 370/542 |

OTHER PUBLICATIONS

Microsoft, Computer Dictionary, Fifth Edition, pp. 225 and 391.*
Microsoft Computer Dictionary, Fifth Edition, pp. 277, 318, 391 and 425.*
JEDEC STANDARD, "Standard Data Transfer Format Between Data Preparation System and Programmable Logic Device Programmer", JESD3-C (Revision of JESD3-B), Jun. 1994, pp. 1-35.

* cited by examiner

*Primary Examiner*—Shahid Alam
*Assistant Examiner*—Fred Ehichioya
(74) *Attorney, Agent, or Firm*—Christopher P. Maiorana, PC

(57) ABSTRACT

A method of generating a file suitable for programming a programmable logic device. The method generally comprises the steps of (A) generating a programming item from a plurality of parameters that define a program for the programmable logic device, (B) storing the programming item in a programming field of the file in response to generating, and (C) storing at least one of the parameters in a non-programming field of the file.

20 Claims, 3 Drawing Sheets

```
Generated by CyClocksRT R1.05.00

Modification Date: 7/23/2001
Comments:
Customer:
FAE:
License #: dj0dk7mb2ec-cc0fn0sp1sn Don't modify file contents after this line:
< Checksum: 74F47101
s NMF3344 f   10.000000 ;External Ref
f  300.000000 ;P113
# f  266.000000 ;P112
# f  300.000000 ;P111, 0x
# f  300.000000 ;P111, 1
# f  300.000000 ;P111, 2
# f  300.000000 ;P111, 3
# f  400.000000 ;P111, 4
# f  400.000000 ;P111, 5
# f  400.000000 ;P111, 6
# f  400.000000 ;P111, 7>

TECHNIQUES FOR JEDEC FILE INFORMATION INTEGRITY AND PRESERVATION OF DEVICE PROGRAMMING SPECIFICATIONS

FIELD OF THE INVENTION

The present invention relates to a method and/or architecture for file integrity generally and, more particularly, to JEDEC file integrity and preservation of programming specifications.

BACKGROUND OF THE INVENTION

Files generated in compliance with the Joint Electron Device Engineering Council (JEDEC) standard JESD3-C are used for programming field programmable logic devices. The JESD3-C standard defines a format for transferring fuse or cell states between a development system and a programmer. The files consist of (i) non-programming fields within a design specification portion, (ii) device programming fields, and (iii) a cyclic redundancy check (CRC) portion.

Programming a device starts with presenting parameters defining a program to the development system along with non-programming type information. The development system generates programmable items from the parameters. The programmable items are then stored in the programmable fields of the file. The non-programmable type information is stored in the non-programming fields of the file.

The JESD3-C standard has several practical limitations. One limitation is that the files cannot be used to reverse calculate the original parameters. A common practice is to dispose of the original device programming parameters once the file has been verified as correct and the programmed devices have gone into production. Consequently, the original intent of the program is lost with the discarding of the parameters.

SUMMARY OF THE INVENTION

The present invention concerns a method of generating a file suitable for programming a programmable logic device. The method generally comprises the steps of (A) generating a programming item from a plurality of parameters that define a program for the programmable logic device, (B) storing the programming item in a programming field of the file in response to generating, and (C) storing at least one of the parameters in a non-programming field of the file.

The objects, features and advantages of the present invention include providing a method and/or architecture for enhanced JEDEC file generation that may (i) preserve the ability to fully recreate the original parameters from the file, (ii) detect a change in bit position/bit values, (iii) substantially reduce tracking through file validation, (iv) preserve input and output frequency parameters, and/or (v) provide full backward compatibility to pre-existing and future JEDEC file readers.

BRIEF DESCRIPTION OF THE DRAWINGS

These and other objects, features and advantages of the present invention will be apparent from the following detailed description and the appended claims and drawings in which:

FIG. 2 is an exemplary file created by the present invention; and

DETAILED DESCRIPTION OF THE PREFERRED EMBODIMENTS

Figure 1:
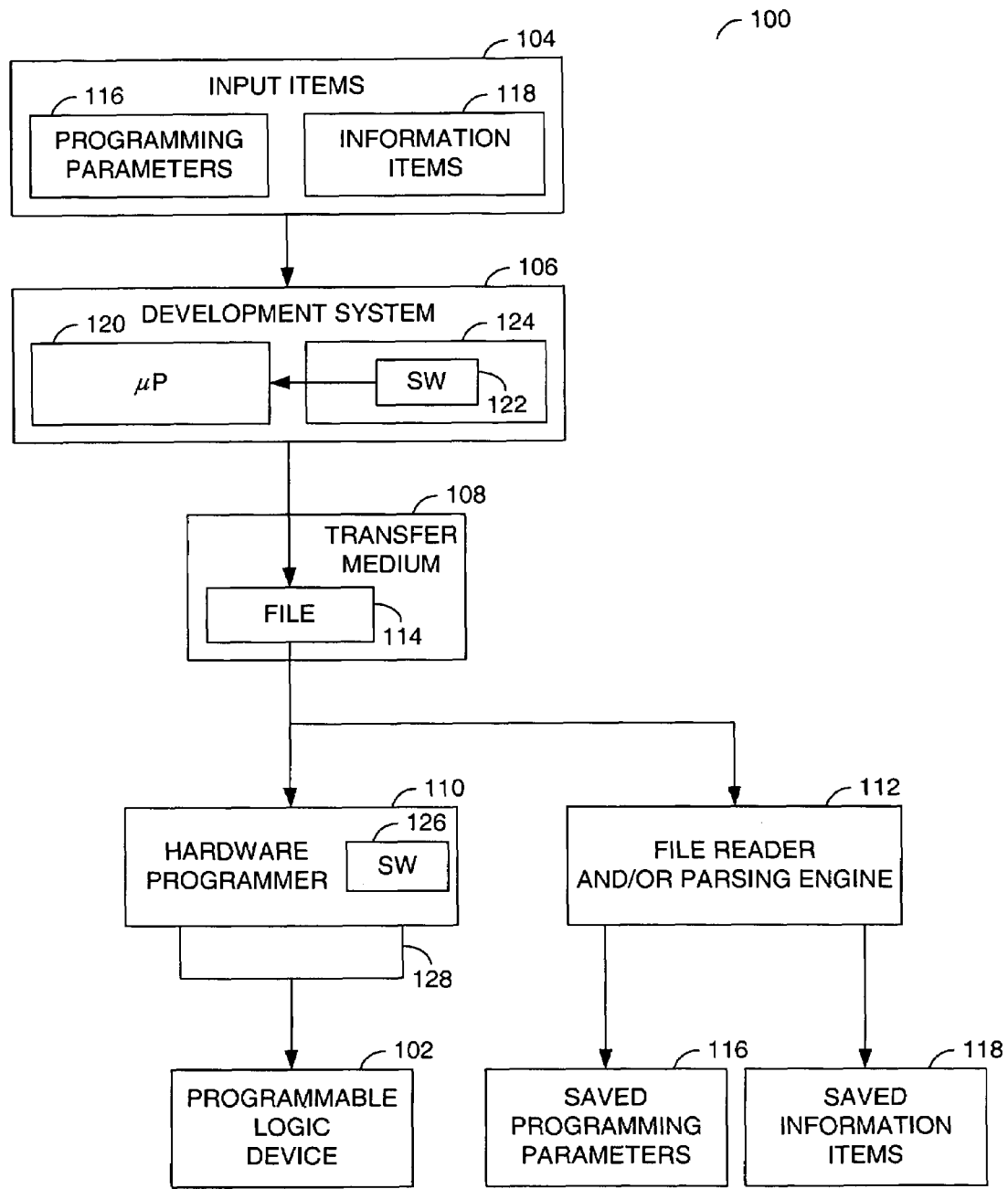
FIG. 1 is a block diagram of a system implementing the present invention.

Referring to FIG. 1, a block diagram of a system 100 is shown in accordance with a preferred embodiment of the present invention. The system 100 may be configured to program a programmable logic device 102 based upon one or more input items 104. The system 100 generally comprises a circuit 106, a transfer medium 108, a circuit 110, and a circuit 112. Other embodiments of the system 100 may include only one of the circuit 110 or the circuit 112. The circuit 106 may be implemented as a development system. The circuit 110 may be implemented as a hardware programmer. The circuit 112 may be implemented as a generic file reader and/or parsing engine. The transmission medium 108 may connect the development system 106 to the hardware programmer 110 and/or the file reader/parsing engine 112 to transfer a file 114.

The development system 106 may be configured to generate the file 114 from the input items 104. The input items 104 may include one or more programming parameters 116. The programming parameters 116 may define a program for configuring the programmable logic device 102. The input items 104 may optionally include one or more information items 118. The information items 118 may be non-programmable data stored in the file 114 for reference purposes. The information items 118 generally do not affect programming of the programmable logic device 102.

The development system 106 may comprise a processor 120 and software 122 residing in a memory 124. The processor 120 may be configured to execute the software 122. The software 122 may instruct the processor 120 to generate the file 114 from the input items 104. The processor 120 may format the file 114 per the Joint Electron Device Engineering Council (JEDEC) standard JESD3-C, hereby incorporated by reference in its entirety. The JESD3-C standard is published by the Electronic Industries Association, Washington, D.C.

The hardware programmer 110 may be controlled by software 126 to program the programmable logic device 102. The programmable logic device 102 may be connected to the hardware programmer 110 through a socket 128 or similar device. The hardware programmer 110 may receive the file 114 from the development system 106 through the transfer medium 108. The hardware programmer 110 may then program or flash the programmable logic device 102 using the programmable items stored within the file 114.

The transfer medium 108 may be configured to distribute the file 114 among the development system 106, the hardware programmer 110, and the file reader/parsing engine 112. The transfer medium 108 may be implemented as a serial communication link, a network, a removable medium such as a disk or tape, or the like. Other forms of the transfer medium 108 may be implemented to meet the design criteria of a particular application.

The file reader/parsing engine 112 may be configured to parse the file 114. The parsing may recover the programming parameters 116 and the information items 118 saved as part of the file 114. The recovered items may be useful in determining the original intent of the program defined by the programming parameters 116. The recovered items may also be useful in debugging and/or analyzing the program defined therein.

Referring to FIG. 2, a diagram of an example file 114 implementing the present invention is shown. The file 114 generally adheres to a specific protocol that instructs the hardware programmer 110 on three basic principles. A first section 130 may be a comment section that outlines device identification and other comments. The fields within the first section 130 may be non-programming. A second section 132 may contain programming fields that store addressing information about where to start placing bits. The event of programming generally begins at a first address location and proceeds in a linear fashion until either an end-of-file is reached or a new address is detected. The second section 132 may be passed through a simple cyclic redundancy check (CRC) process and compared against a CRC value stored in a final section 134. The comparison may verify the accuracy of the contents of the file 114.

One or more special comment lines 136 may be included in the first section 130 to store some or all of the programming parameters 116 and the information items 118. In general, the comment lines 136 may comprise one or more lines and/or fields bracketed by delimiters. Existing and future third-party hardware programmers 110, file readers/paring engines 112, and other equipment that may read the file 114 may be compatible the comment lines 136 per the JESDC-3 standard because the comment lines 136 are within the first section 130.

A general format of a first comment line 136 may be given by, "x Checksum: aaaaaaaa". The field "x" may represent a starting delimiter (e.g., "<"). The field "aaaaaaaa" may be implemented as a non-programming field than may store an error detection item. In one embodiment, the error detection item may be a unique CRC checksum that may be independent from the JESD3-C standard CRC value. The unique CRC checksum may be used by the development systems 106, the hardware programmers 110, the file readers/parsing engines 112, and other equipment to verify the file 114.

A general format of a second comment line 136 may given by "# z bbbbbbbbbb". The field "z" may represent another type of delimiter (e.g., "s"). The field "bbbbbbbbbb" may be implemented as a non-programming field that may store an information item 118. In one embodiment, the delimiter "s" may indicate that the following field "bbbbbbbbbb" may contain a device part number.

A general format of additional comment lines 136 may be given by "# w ccccccccc; dddddddddd". The field "w" may represent another delimiter (e.g., "f"). The field "ccccccccc" may be implemented as a non-programming field that may store a programming parameter 116. The field "dddddddddd" may be implemented as a non-programming field that may store an information item 118. In one embodiment, the delimiter "f" may indicate that the following field "ccccccccc" may contain a frequency used to program the programmable logic device 102. The field "dddddddddd" may contain a comment describing the programming parameter 116 stored in the field "ccccccccc".

A general format of a final comment line 136 may be given by "# w ccccccccc; dddddddddd y". The field "y" may represent an ending delimiter (e.g., ">") Additional fields and delimiters may be defined within the comment lines 136 to meet the design criteria of a particular application.

The delimiters may be implemented as a character, a symbol, a number, or the like. The delimiters may distinguish the comment lines 136 to the development systems 106, the hardware programmers 110, the file readers/parsing engines 112, and other equipment capable of reading the file 114. In one embodiment, the presence of carriage returns and line feeds between the delimiters may be ignored.

In an example, the programmable logic device 102 may be a programmable multiple phase-lock loop (PLL) device. The following applications may be used for the various fields of the comment lines 136. The "aaaaaaaa" field may store the unique checksum value (e.g., "74F47101") for the file 114. The "bbbbbbbbbb" field may store the device part number (e.g., "NMN3344"). The following fields "ccccccccc" and "dddddddddd" may store frequencies at various interfaces of the programmable logic device 102. In particular, the third comment line 136 may store an external reference frequency. The fourth through last comment lines 136 may store output frequencies for the various PLLs.

Generation of the unique CRC checksum may consist of a series of registers. Starting immediately after the unique CRC checksum field (e.g., the "aaaaaaaa" field) or starting from the second portion 132, the file 114 may be read as an input data stream into a first register sequentially and "clocked" through the series of registers in tandem. Feedback may be provided where values of some registers are feed back to some previous registers. The feedback may be dependent upon coefficients that define a polynomial. Presentation of the input data stream into the generation process may continue until the whole ASCII "binary" bit input data stream has been entered. Once the entire input data stream has been entered, taps from specific registers may be used to generate the unique CRC checksum value.

The accuracy of the generation process generally depends on the number of registers and the coefficients of the polynomial. In one embodiment, there may be 21 stage registers and a predetermined polynomial. The combination of 21 registers and the predetermined polynomial may achieve a detection accuracy to a resolution that may detect a presence of a bit swap(s). Bit swapping may include swapping of position and/or swapping of values. Other combinations of registers and coefficients may be implemented to meet the design criteria of a particular application.

The generation process may be implemented in hardware, firmware, software, micro code, or any combination of hardware, firmware, software and micro code. The following is an example of a unique CRC checksum generation process implemented as a software program having 21 registers and a polynomial having all initial coefficients set to zero. The input data stream may be represented by an array[s]. The example code may be:

```
void   SONOS::calculateChecksum(int   tempEnd,   char
    array[ ], char checksum[ ])
{
  unsigned short reg[21];
  unsigned short temp;
  int j=20;
  for (int k=0; k<21; k++)
  {
    reg[k]=0;
  }
  temp=reg[20];
  // There are 21 registers to store polynomial coefficients
  // and 7 adders to calculate unique CRC checksum in this
    process for (int s=0; s<tempEnd; s++)
  {
    reg[0]=array[s]+temp;
    reg[3]=reg[2]+temp;
    reg[6]=reg[5]+temp;
    reg[9]=reg[8]+temp;
```

```
    reg[12]=reg[11]+temp;
    reg[15]=reg[14]+temp;
    reg[18]=reg[17]+temp;
    temp=reg[20];
    // Shifting registers
    for (int j=20; j>0; j--)
    {
        reg[j]=reg[j-1];
    }
    int tempcurrent=0;
    tempcurrent +=sprintf (checksum+tempCurrent, "%4X
       %4X", reg[15], reg[10]);
    checksum[tempcurrent]='\0';
}
```

Other unique CRC checksum generation processes may be implemented to meet the design criteria of a particular application.

Figure 3:
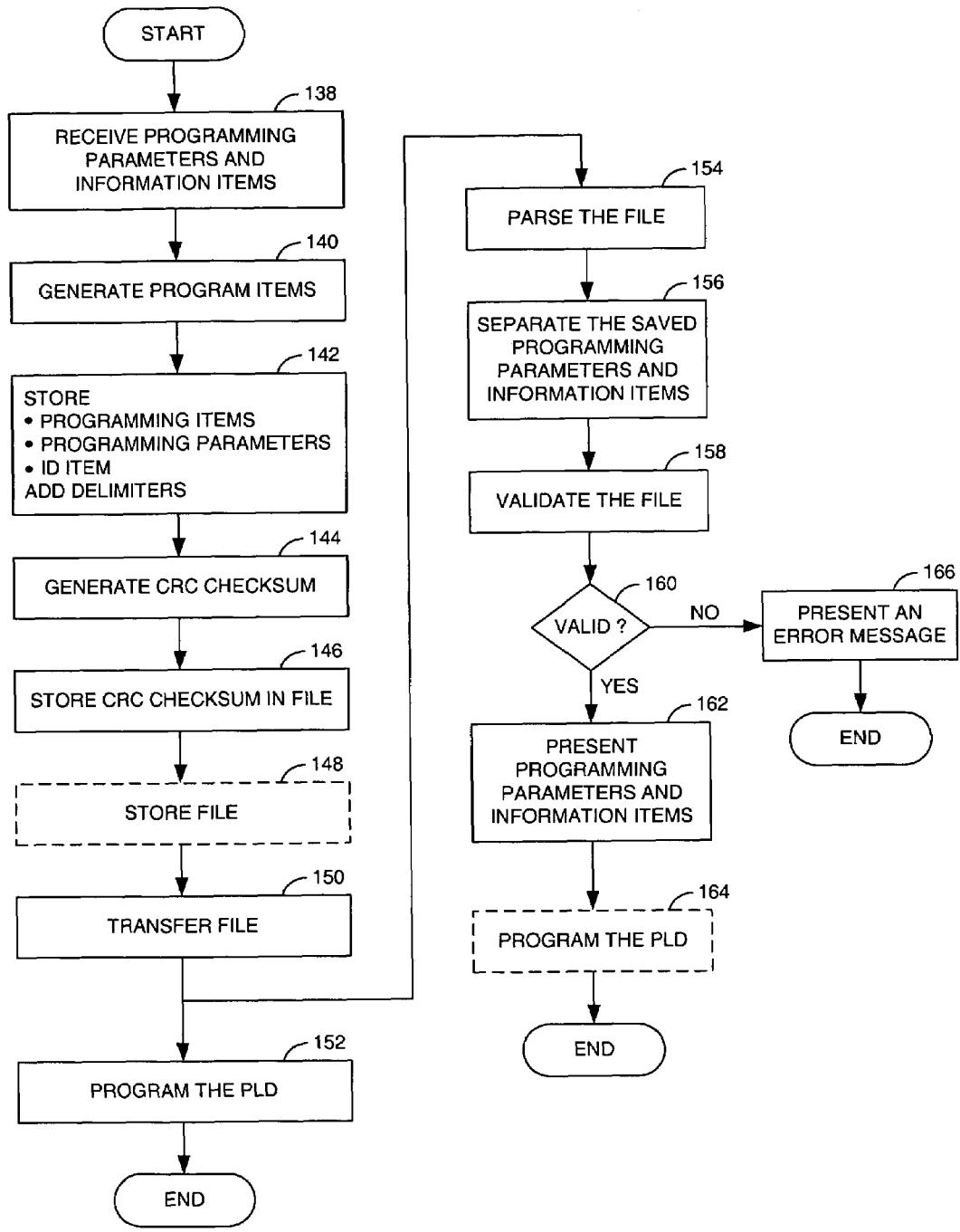
FIG. 3 is a flow diagram of a process for generating and using a modified JEDEC file.

Referring to FIG. 3, a flow diagram of a method of generating and using the file 114 is shown. The process may begin with reception of the programming parameters 116 and the information items 118 by the development system 106 (e.g., block 138). The processor 120 may then generate the programming items from the programming parameters 116 (e.g., block 140). The processor 120 may store, in no particular order, (i) the programming items in the programmable fields, (ii) selected programming parameters 116 in the non-programming fields of the comment lines 136, (iii) the identification item in a non-programming field of the comment lines 136, and (iv) add the starting delimiter and the ending delimiter to the comment lines 136 (e.g., block 142).

Once the processor 120 has generated the second portion 132 of the file 114, the processor 120 may generate the unique CRC checksum (e.g., block 144). The unique CRC checksum may be stored in a non-programmable field of the comment lines 136 (e.g., block 146). Optionally, the completed file 114 may be stored within the development system 106 for later transmission (e.g., block 148).

To program a programmable logic device 102, the file 114 may be transferred from the development system 106 to the hardware programmer 110 (e.g., block 150). The hardware programmer 110 may then use the second portion 132 of the file 114 to flash the program into the programmable logic device 102 (e.g., block 152). Programming may then be repeated with additional programmable logic devices 102 using the same file 114.

To recover the saved programming parameters 116, identification items 118, and/or the unique CRC checksum, the file 114 may be transferred to the file reader/parsing engine 112 (e.g., block 150). The file reader/parsing engine 112 may parse the file 114 using the delimiters to extract the comment line or lines 136 (e.g., block 156). The comment lines 136 may then be separated by the fields into the identification items 118, the programming parameters 116 and the unique CRC checksum (e.g., block 156).

The file 114 may then be validated against the unique CRC checksum (e.g., block 158). If the file 114 passes the validation (e.g., the YES branch of decision block 160), then the extracted programming parameters 116 and identification items 118 may be presented for display (e.g., block 162). In situations where the file reader/parsing engine 112 also has a programming capability, then the validated second portion 132 of the file 114 may be used to program the programmable logic device (e.g., block 164). If the file 114 fails the validation (e.g., the NO branch of decision block 160), then an error message may be presented for display (e.g., block 166).

The function performed by the flow diagram of FIG. 3 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions (or computer program) which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method of generating a file, the method comprising the steps of:
   (A) generating a programming item from a plurality of parameters that define a program for a programmable logic device;
   (B) storing said programming item in a programming field of said file suitable for programming said programmable logic device;
   (C) storing at least one of said parameters device in a non-programming field of said file;
   (D) generating an error detection item;
   (E) storing said error detection item in a second non-programming field of said file;
   (F) storing another of said parameters in a third non-programming field of said file;
   (G) storing an identification item in a fourth non-programming field of said file; and
   (H) bracketing a combination of said non-programming field, said second non-programming field, said third non-programming field, and said fourth non-programming field with a pair of delimiters.

2. The method according to claim 1, wherein step (C) comprises storing a frequency parameter in said non-programming field.

3. The method according to claim 1, further comprising the step of second storing one of said parameters used for generating said programming item in a fifth non-programming field of said file.

4. The method according to claim 3, wherein said second storing comprises storing a frequency parameter in said fifth non-programming field.

5. The method according to claim 1, further comprising the steps of:

generating an error detection item; and
storing said error detection item in a fifth on-programming field of said file.

6. The method according to claim 5, wherein said error detection item is a cyclic redundancy check checksum.

7. The method according to claim 6, wherein said cyclic redundancy check checksum is configured to detect a bit swap within said file.

8. The method according to claim 1, further comprising the step of storing an identification item configured to identify said programmable logic device in a fifth non-programming field of said file.

9. The method according to claim 1, further comprising the step of bracketing said non-programming field with a pair of delimiters.

10. A storage medium comprising a medium and a computer program for use in a computer to generate a file, the medium distributing the computer program that is readable and executable by the computer, the computer program including the steps of:
(A) generating a programming item from a plurality of parameters that define a program for a programmable logic device;
(B) storing said programming item in a programming field of said file suitable for programming said programmable logic device;
(C) storing at least one of said parameters in a non-programming field of said file;
(D) generating an error detection item;
(E) storing said error detection item in a second non-programming field of said file;
(F) storing another of said parameters in a third non-programming field of said file;
(G) storing an identification item in a fourth non-programming field of said file; and
(H) bracketing a combination of said non-programming field, said second non-programming field, said third non-programming field, and said fourth non-programming field with a pair of delimiters.

11. The storage medium according to claim 10, wherein step (C) comprises storing a frequency parameter in said non-programming field.

12. The storage medium according to claim 10, wherein said computer program further comprises the step of second storing one of said parameters used for generating said programming item in a fifth non-programming field of said file.

13. The storage medium according to claim 12, wherein said second storing comprises storing a frequency parameter in said fifth non-programming field.

14. The storage medium according to claim 10, wherein said computer program further comprises the steps of:
generating an error detection item; and
storing said error detection item in a fifth non-programming field of said file.

15. The storage medium according to claim 14, wherein said error detection item is a cyclic redundancy check checksum.

16. The storage medium according to claim 15, wherein said cyclic redundancy check checksum is configured to detect a bit swap within said file.

17. The storage medium according to claim 10, wherein said computer program further comprises the step of storing an identification item configured to identify said programmable logic device in a fifth non-programming field of said file.

18. The storage medium according to claim 10, wherein said computer program further comprises the step of bracketing said non-programming field with a pair of delimiters.

19. A system comprising:
means for generating a programming item from a plurality of parameters that define a program for a programmable logic device;
means for storing said programming item in a programming field of a file suitable for programming said programmable logic device;
means for storing at least one of said parameters in a non-programming field of said file;
means for generating an error detection item;
means for storing said error detection item in a second non-programming field of said file;
means for storing another of said parameters in a third non-programming field of said file;
means for storing an identification item in a fourth non-programming field of said file; and
means for bracketing a combination of said non-programming field, said second non-programming field, said third non-programming field, and said fourth non-programming field with a pair of delimiters.

20. The system according to claim 19, wherein said file is compatible with a Joint Electron Device Engineering Council JESD3-C standard.

* * * * *